United States Patent [19]

Boskamp

[11] Patent Number: 4,859,947
[45] Date of Patent: Aug. 22, 1989

[54] MAGNETIC RESONANCE IMAGING APPARATUS COMPRISING A STACKED SURFACE COIL SYSTEM

[75] Inventor: Eddy B. Boskamp, Eindohoven, Netherlands

[73] Assignee: U.S. Philips Corporation, New York, N.Y.

[21] Appl. No.: 117,003

[22] Filed: Nov. 4, 1987

[30] Foreign Application Priority Data

Nov. 27, 1986 [NL] Netherlands ................ 8603006

[51] Int. Cl.$^4$ .................................... G01R 33/20
[52] U.S. Cl. ............................ 324/318; 324/322
[58] Field of Search ............ 324/300, 307, 309, 318, 324/322, 319; 128/653

[56] References Cited

U.S. PATENT DOCUMENTS

| | | | |
|---|---|---|---|
| 4,361,807 | 11/1982 | Burl et al. | 324/309 |
| 4,398,149 | 8/1983 | Zens | 324/319 |
| 4,592,363 | 6/1986 | Krause | 324/322 |
| 4,616,181 | 10/1986 | Kemner | 324/318 |
| 4,636,730 | 1/1987 | Bottomley | 324/322 |
| 4,652,827 | 3/1987 | Eguchi et al. | 324/322 |

OTHER PUBLICATIONS

Japanese Patent Abstract, vol. 9, No. 285, p. 404 (11/12/85), "RF Coil for NMR-CT", Matsumoto.

*Primary Examiner*—Michael J. Tokar
*Attorney, Agent, or Firm*—Thomas A. Briody; Jack E. Haken; Jack D. Slobod

[57] ABSTRACT

A magnetic resonance imaging apparatus includes a cascade of surface coils for detection so that larger objects can be measured while the attractive signal-to-noise ratio of surface coils is retained without mutual re-orientation of coils with respect to the object being required. By introducing a partial overlap between successive coils, suitable homogeneity can be achieved for the detection.

11 Claims, 1 Drawing Sheet

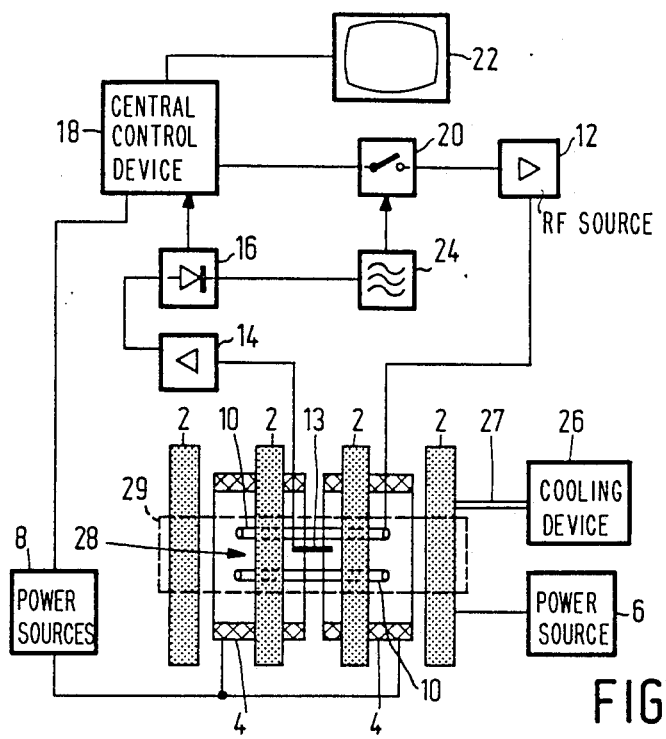
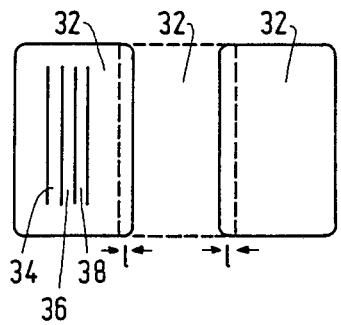
FIG.2
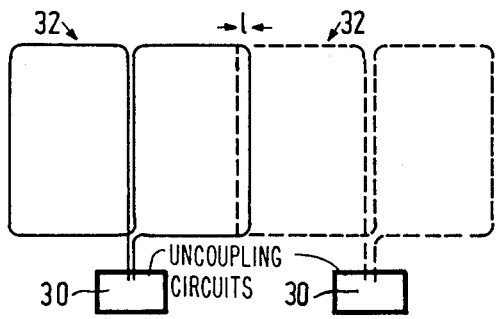
FIG.3
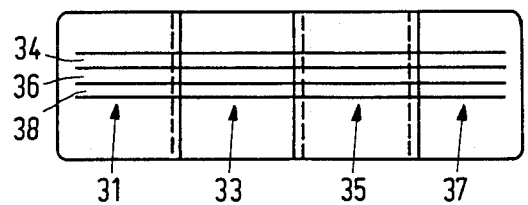
FIG.4

MAGNETIC RESONANCE IMAGING APPARATUS COMPRISING A STACKED SURFACE COIL SYSTEM

The invention relates to a magnetic resonance imaging apparatus, comprising a magnet system for generating a steady magnetic field, a magnet system for generating gradient fields, an rf transmitter coil, and an rf surface coil system for detecting magnetic resonance signals to be generated in an object to be examined.

An apparatus of this kind is known from EP 164164 corresponding to U.S. application Ser. No. 031064 filed Mar. 26, 1987 as a continuation of an earlier filed application.

An apparatus described therein is found to have a drawback in that, if the surface coil is constructed for a desired improved signal-to-noise ratio for the detection signals without displacement of the coil with respect to an object to be examined, only a comparatively small part of the object can be measured.

It is the object of the invention to eliminate this restriction without affecting the signal-to-noise ratios. To achieve this, a magnetic resonance apparatus of the kind set forth in accordance with the invention is characterized in that the rf surface coil system comprises a cascade of consecutive surface coils.

Because the rf coil system in accordance with the invention comprises a plurality of consecutive coils, the attractive signal-to-noise ratio is maintained for each of the coils upon detection, so that a large object can still be completely measured by switching over to a next coil of the cascade.

In a preferred embodiment, successive coils partly overlap so that the spatial homogeneity upon detection is optimized. If desirable, a boundary cross-section in the object can be measured by two successive coils and correction can be made for any discrepancies. For example, for the measurement of regions which are situated deeper within an object, a coil system may comprise pairs of sets of coils to be symmetrically arranged about the object. To this end, the coils are accommodated, for example, in a flexible band which can be arranged around an object to be measured. Alternatively, for example one system may be rigidly connected to an object carrier and a second system may be arranged so as to be pivotable and displaceable in the carrier. The coils are preferably mounted so as to be curved to the extent possible to enable conformity with the shape of an object.

In a further preferred embodiment, the rf coil system comprises coils for measuring sagittal cross-sections and, due to the expiration of time between successive measurements for a cross-section, large differences could occur in the strength of the detection signals. This drawback can be avoided by using an adapted measuring method where each time parts of one and the same cross-section are measured.

In a further preferred embodiment, the rf coil system comprises a cascade of butterfly coils so that, when use is made of a uniform transmission field, each of the coils is already uncoupled by its geometry in respect of interference by the transmission field. When use is made of roof-shaped butterfly coils, the orientation in the transmission field is limited to preferred directions in order to maintain automatic uncoupling.

Some preferred embodiments in accordance with the invention will be described in detail hereinafter with reference to the drawing. Therein:

FIG. 1 shows a magnetic resonance imaging apparatus comprising an rf coil system in accordance with the invention, and FIGS. 2, 3 and 4 shows preferred embodiments of coil system for such an apparatus.

A magnetic resonance imaging apparatus as shown in FIG. 1 comprises a magnet system 2 for generating a steady, uniform magnetic field, a magnet system 4 for generating magnetic gradient fields, and power supply sources 6 and 8 for the magnet system 2 and the magnet system 4, respectively. A magnet coil 10 for generating an rf magnetic alternating field is connected to an rf source 12. A surface coil 13 is provided for the detection of magnetic resonance signals generated by the rf transmission field in an object to be examined. For reading, the coil 13 is connected to a signal amplifier 14. The signal amplifier 14 is connected to a phase-sensitive rectifier 16 which is connected to a central control device 18. The central control device 18 also controls a modulator 20 for the rf source 12, the supply source 8 for the gradient coils, and a monitor 22 for display. An rf oscillator 24 controls the modulator 20 as well as the phase-sensitive rectifier 16 which processes the measurement signals. For cooling, if any, there is provided a cooling device 26 which comprises cooling ducts 27. A cooling device of this kind can be constructed as a water cooling system for resistance coils or as a liquid helium dewar system for superconducting coils. The transmitter coil 10 which is arranged within the magnet systems 2 and 4 encloses a measurement space 28 which offers sufficient room for a patient in the case of medical diagnostic apparatus. Thus, in the measurement space 28 there can be generated a steady magnetic field, gradient fields for position selection of slices to be imaged, and a spatially uniform rf alternating field. The measurement space is shielded against interference fields by a Faraday cage 29.

In accordance with the invention, within the measurement space 28 there is arranged a cascade of surface coils 32 so that all cross-sections of the object, in as far as covered by the measurements space 28, can be measured with a suitable signal-to-noise ratio without any displacement of the object or coils being required. In a measurement space in which, for example sufficiently exactly defined gradient fields and a sufficiently spatially uniform transmission field can be generated over a length of 50 cm, a cascade of for example three surface coils having a length dimension of, for example 20 cm thus enables measurement across the entire length of the measurement space. In a configuration of this kind the coils of the cascade overlap in that direction over a distance of, for example approximately 5 cm. In practical cases it has been found that an overlap of from approximately 2 to 5 cm is more than adequate in order to maintain sufficient detection homogeneity. The degree of overlap can also be chosen so that the mutual inductance between the two coils is minimized. In practical cases it has been found that this occurs in the case of the given degree of overlap. Using this configuration and measurement method, signals are supplied by one and the same coil for any cross-section measured. This is achieved with at the most the additional condition of the possibility of measurement of a transitional cross-section by two successive coils. Therefore, nothing in the measurement method need be changed in comparison with customary methods, other than a switch-over to a next coil which is synchronized with the position of the cross-section to be measured.

A feasible cascade system is diagrammatically shown in FIG. 2 which shows successive coils 32 which overlap over a distance 1 of, for example 2 cm. In addition to the uncoupling of the measurement coils, during the active period of a transmitter coil as described in EP 164164, it must also be ensured that no undesirable cross-talk occurs between coils of the cascade. If this requirement cannot be sufficiently satisfied by the geometry and mutual orientation, use can also be made of uncoupling method as disclosed in EP 164164.

The necessity of electronic uncoupling for mutual influencing between a transmitter coil and each of the coils of the cascade can be avoided by utilizing coils having a butterfly configuration for the cascade of measurement coils, because such butterfly coils already compensate for this coupling because of their geometry. FIG. 3 shows a cascade of butterfly coils in accordance with the invention, the successive coils 32 being arranged so that a given overlap (1) occurs only for the wings. For active uncoupling, it is merely necessary to prevent any mutual influencing of the coils of the cascade itself; for this purpose there may be provided an uncoupling circuit 30.

Contrary to the previously described systems, in a cascade as shown in FIG. 4, signals of different coils are used for each of the, in this case, sagittal cross-sections 34, 36 and 38. Due to the time difference occurring in the measurement after the excitation, transients will occur in the strength of the detection signals so that an adverse effect could be exerted on the image quality. In order to avoid this phenomenon, detection can be methodically performed, parts of different cross-sections then being measured by successive coils so that cross-section parts measured after the same relaxation time can be combined so as to form a complete sagittal cross-secton. Cross-sections can thus be composed, for example step-wise from parts 31, 33, 35 and 37 of the cross-sections. Alternatively, after each activation only a single part of the cross-section can be measured, but such a procedure has an adverse affect on the duration of the measurement.

Such a sagittal coil configuration can also be composed of butterfly coils, in which case it may be desirable to omit the overlapping in a direction transversely of the previously mentioned direction in order to obtain an adapted geometry, for example when use is made of roof-shaped butterfly coils. Because parts of the hinges of the butterfly coils then overlap, it may be desirable to provide the aperture of the coils, that is to say the incoming and outgoing conductors, in another part of the coil. A feasible butterfly coil can also be formed by composing each of the wings from a separate conductor, having the same inductance L, and a common conductor in which there is included a capacitance for uncoupling the coil for transmission fields which load each of the wings to the same extent.

What is claimed is

1. A magnetic resonance imaging apparatus, comprising magnet systems for generating a steady magnetic field and gradient magnetic fields, an rf transmitter coil, and an rf surface coil system for placement along a surface of an object for detecting magnetic resonance signals to be generated in said object, wherein said rf surface coil system comprises a cascade of individually operatively selectable successive, substantially identical surface coils, corresponding parts of each successive coil in said cascade being offset along said object surface from those of the preceding surface coil in said cascade.

2. A magnetic resonance imaging apparatus as claimed in claim 1, characterized in that successive coils of the cascade partly overlap.

3. A magnetic resonance imaging apparatus as claimed in claim 1, characterized in that a cascade of coils is accommodated in a band-shaped carrier which can be flexibly arranged about an object to be measured.

4. A magnetic resonance imaging apparatus as claimed in claim 1, characterized in that the cascade comprises coils which are diametrically arranged with respect to an object to be measured.

5. A magnetic resonance imaging apparatus as claimed in claim 2, characterized in that the cascade comprises coils which are diametrically arranged with respect to an object to be measured.

6. A magnetic resonance imaging apparatus as claimed in any one of claims 1 to 3, characterized in that the cascade coils are arranged so that detection signals for an image of a cross-section are supplied by one and the same coil.

7. A magnetic resonance imaging apparatus as claimed in any one of the claims 1 to 3, characterized in that for the measurement of sagittal cross-sections use is made of a cascade configuration of coils, signals from a plurality of coils being used for one complete cross-section.

8. A magnetic resonance imaging apparatus as claimed in claim 7, characterized in that there are provided signal selection means for obtaining such a combination of detection signals for parts of cross-sections that a complete cross-section can be formed from signals which have all been detected substantially the same time after excitation.

9. A magnetic resonance imaging apparatus as claimed in any of the claims 1 to 3, characterized in that the cascade of surface coils comprises butterfly coils.

10. A magnetic resonance imaging apparatus as claimed in claim 2, characterized in that a cascade of coils is accommodated in a band-shaped carrier which can be flexibly arranged about an object to be measured.

11. A magnetic resonance imaging apparatus as claimed in claim 4 or claim 5, characterized in that one of the coil parts is rigidly connected to an object carrier, a second coil part being adjustably connected thereto.

* * * * *